(12) United States Patent
Chen et al.

(10) Patent No.: US 11,418,157 B1
(45) Date of Patent: Aug. 16, 2022

(54) GAIN CONTROL CIRCUIT FOR TRANSMITTER AND METHOD THEREOF

(71) Applicant: Realtek Semiconductor Corporation, Hsinchu (TW)

(72) Inventors: Beng-Meng Chen, Hsinchu (TW); Chien-Jung Huang, Hsinchu (TW); Jhih-Yuan Ke, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 17/337,588

(22) Filed: Jun. 3, 2021

(30) Foreign Application Priority Data

Feb. 4, 2021 (TW) .................................. 110104325

(51) Int. Cl.
| H04B 1/04 | (2006.01) |
| H03F 3/24 | (2006.01) |
| H04L 27/00 | (2006.01) |
| H03F 1/30 | (2006.01) |
| H03G 3/30 | (2006.01) |

(52) U.S. Cl.
CPC .............. *H03F 3/24* (2013.01); *H03G 3/3042* (2013.01); *H04B 1/04* (2013.01); *H03F 2200/105* (2013.01); *H04B 2001/0416* (2013.01)

(58) Field of Classification Search
None
See application file for complete search history.

(56) References Cited

U.S. PATENT DOCUMENTS

| 7,469,491 B2* | 12/2008 | McCallister | H04B 1/0475 375/269 |
| 8,653,902 B2* | 2/2014 | Kitamura | H04B 1/0475 332/149 |
| 2006/0030274 A1* | 2/2006 | Kappes | H03G 3/3042 455/73 |

FOREIGN PATENT DOCUMENTS

| CN | 1186575 A * | 7/1998 | ........... H03G 3/3042 |
| EP | 1330885 B1 * | 6/2005 | ........... H03G 3/3036 |
| EP | 1193865 B1 * | 4/2009 | ........... H03F 1/3247 |

\* cited by examiner

*Primary Examiner* — Pablo N Tran

(74) *Attorney, Agent, or Firm* — Locke Lord LLP; Tim Tingkang Xia, Esq.

(57) ABSTRACT

A gain control circuit utilized in a transmitter is disclosed. The transmitter is configured to amplify an input signal according to a gain via a digital amplifier, an analog amplifier and a power amplifier, to generate an output signal. The gain control circuit includes a correction unit configured to calculate a correction power according to an elapsed time since a current packet transmission duration of the transmitter is completed. The gain control circuit adjusts the gain according to the correction power, a transmitter signal strength indication of the input signal and an environment temperature of the transmitter.

16 Claims, 5 Drawing Sheets

GAIN CONTROL CIRCUIT FOR TRANSMITTER AND METHOD THEREOF

CROSS-REFERENCE TO RELATED APPLICATION

This application claims priority to Taiwan Patent Application Serial No. 110104325 filed on Feb. 4, 2021, which is incorporated herein by reference in its entirety.

BACKGROUND

Field of Invention

The present disclosure relates to a gain control circuit and method thereof, and more particularly, to a gain control circuit and method thereof that is utilized in a transmitter.

Description of Related Art

In a transmitter of a radio-frequency (RF) communication system, a power amplifier (PA) is configured to amplify RF signals generated by the transmitter, and then the RF signals are radiated by an antenna, so as to realize wireless communication. However, operating characteristics of the power amplifier (e.g., linearity) varies as an environmental temperature varies. Therefore, in order to ensure communication quality, a gain control circuit is required to track an output power of the transmitter to adjust a gain of the transmitter accordingly, such that a difference between the output power and a target power of the transmitter can be minimized.

Therefore, it is a critical topic in the industry to provide a gain control circuit and method thereof, in order to minimize the difference between the output power and the target power of the transmitter.

SUMMARY

In order to improve the issue as above mentioned, an objective of the present disclosure is to provide a gain control circuit utilized in a transmitter. The transmitter includes a digital amplifier, an analog amplifier, and a power amplifier. The digital amplifier, the analog amplifier and the power amplifier are configured to amplify an input signal according to a gain, to generate an output signal. The gain control circuit includes a correction unit, an adder, a target power lookup table, a comparator, and an automatic gain controller. The correction unit is configured to generate a correction power according to an elapsed time since a current packet transmission duration of the transmitter is completed. The adder is connected to the correction unit, and configured to calculate a current output power according to the correction power, a transmitter signal strength indication of the input signal and an environmental temperature of the transmitter. The target power lookup table is configured to generate a target power corresponding to a next output power. The comparator is connected to the adder and the target power lookup table, and configured to compare the current output power and the target power, to calculate a compensated power. The automatic gain controller is connected to the comparator and the power amplifier, and configured to adjust the gain according to the compensated power.

Another objective of the present disclosure is to provide a gain control method utilized in a transmitter including a digital amplifier, an analog amplifier and a power amplifier. The digital amplifier, the analog amplifier and the power amplifier are configured to amplify an input signal according to a gain, to generate an output signal. The gain control method includes generating a correction power according to an elapsed time since a current packet transmission duration of the transmitter is completed; calculating a current output power according to the correction power, a transmitter signal strength indication of the input signal, and an environmental temperature of the transmitter; comparing the current output power and a target power corresponding to a next output power, to calculate a compensated power; and adjusting the gain of the digital amplifier, the analog amplifier and the power amplifier according to the compensated power.

In the gain control circuit and method thereof of the present disclosure, the gain of the digital amplifier, the analog amplifier and the power amplifier is adjusted according to the correction power when the elapsed time since the current packet transmission duration of the transmitter is completed is greater than or equal to the threshold, such that the next output power will not be overcompensated. Therefore, a difference between the output power and the target power of the transmitter can be minimized.

BRIEF DESCRIPTION OF THE DRAWINGS

The foregoing aspects and many of the accompanying advantages of this disclosure will become more readily appreciated as the same disclosure becomes better understood by reference to the following detailed description, when taken in conjunction with the accompanying drawings.

DETAILED DESCRIPTION

The detailed explanation of the present disclosure is described as following. The described preferred embodiments are presented for purposes of illustrations and description, and they are not intended to limit the scope of the present disclosure.

Figure 1:
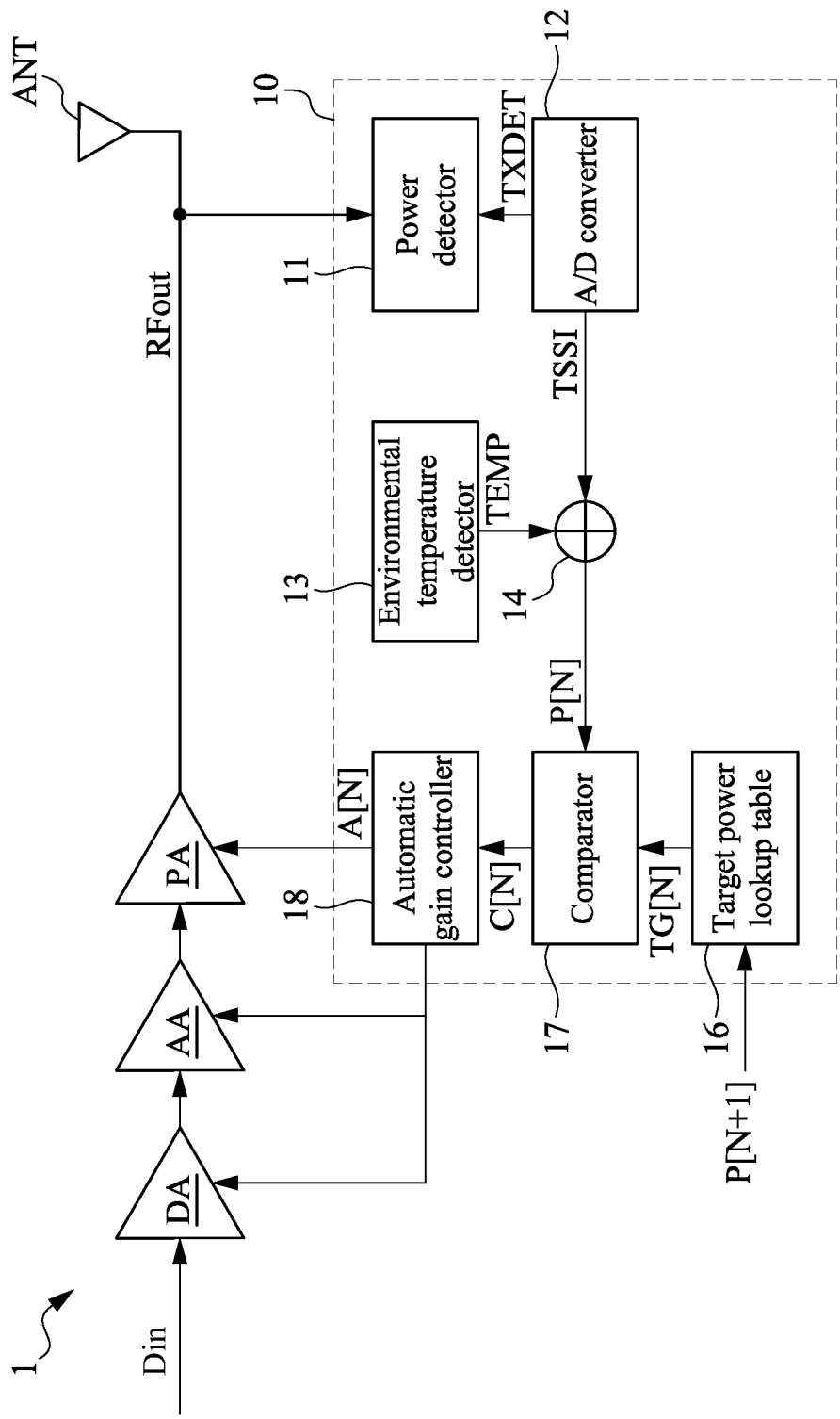
FIG. 1 is a functional block diagram of a transmitter.

FIG. 1 is a functional block diagram of a transmitter 1. The transmitter 1 includes a gain control circuit 10, a digital amplifier DA, an analog amplifier AA, a power amplifier PA, and an antenna ANT. The gain control circuit 10 includes a power detector 11, an analog-to-digital (A/D) converter 12, an environmental temperature detector 13, an adder 14, a target power lookup table 16, a comparator 17, and an automatic gain controller (AGC) 18.

The transmitter 1 may be utilized in a wireless communication device, such as a microwave integrated circuit (IC) transceiver or a microwave transceiver system. A baseband circuit (not shown in FIG. 1) of the transmitter 1 is configured to generate an input signal Din. In some embodiment, the input signal Din can be a digital input signal. In the transmitter 1, the digital amplifier DA, the analog amplifier AA and the power amplifier PA are configured to amplify the input signal Din according to a gain $A[N]$, to generate an output signal RFout. The antenna ANT is connected to the power amplifier PA, and configured to radiate the output signal RFout to the air.

In the gain control circuit 10, the power detector 11 is connected to an output terminal of the power amplifier PA, and configured to generate a detected power TXDET according to the output signal RFout. The A/D converter 12 is connected to the power detector 11, and configured to convert the detected power TXDET with analog representation into a transmitter signal strength indication (TSSI) with digital representation. The environmental temperature detector 13 is configured to detect an environmental temperature TEMP of the transmitter 1. The adder 14 is connected to the A/D converter 12 and the environmental temperature detector 13, and configured to calculate a current output power P[N] according to the transmitter signal strength indication and the environmental temperature TEMP currently. The target power lookup table 16 is configured to generate a target power TG[N] corresponding to a next output power P[N+1]. The comparator 17 is connected to the adder 14 and the target power lookup table 16, and configured to compare the current output power P[N] and the target power TG[N], to calculate a compensated power C[N]. The automatic gain controller 18 is connected to the comparator 17, the digital amplifier DA, the analog amplifier AA and the power amplifier PA, and configured to calculate the gain A[N] according to the compensated power C[N].

Simply speaking, the gain control circuit 10 is configured to calculate the current output power P[N] according to the transmitter signal strength indication of the output signal RFout and the environmental temperature TEMP currently, then calculate a difference between the current output power P[N] and the target power TG[N] to calculate the compensated power C[N], and finally adjust the gain A[N] of the digital amplifier DA, the analog amplifier AA and the power amplifier PA via the automatic gain controller 18. As a result, the gain control circuit 10 may realize automatic power tracking to adjust the gain A[N] of the digital amplifier DA, the analog amplifier AA and the power amplifier PA accordingly, such that a difference between the power of the output signal RFout and the target power TG[N] can be minimized.

Figure 2:
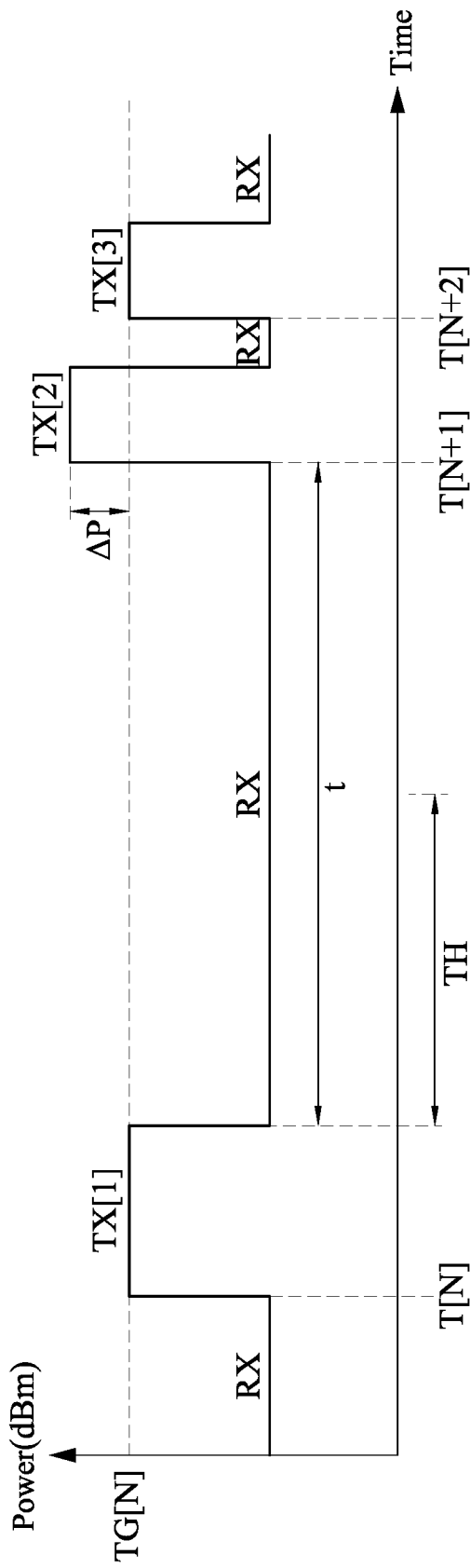
FIG. 2 is a schematic view of output power versus time of the power amplifier in FIG. 1.

FIG. 2 is a schematic view of output power versus time of the gain control circuit 10 in FIG. 1. Given that a target power of the transmitter 1 is TG[N] within any packet transmission duration TX of the transmitter 1, and a target power of the transmitter 1 is lower the target power TG[N] within a packet reception duration RX of the transmitter 1, which is not limited. In FIG. 2, a current packet transmission duration TX[1] begins at a current time T[N], a next packet transmission duration TX[2] begins at a next time T[N+1], and an after next packet transmission duration TX[3] begins at an after next time T[N+2]. However, applicant notices that, when a time difference t between two consecutive packet transmission durations TX has reached to a threshold TH, the amplifier (i.e., at least one of the digital amplifier DA, the analog amplifier AA and the power amplifier PA) has been cooling down because the amplifier has not been generating high output power for a period of time, and characteristics of the amplifier have changed, which leads to the output power being overcompensated by the gain control circuit 10. On the other hand, when the time difference t between two consecutive packet transmission durations TX has not reached to the threshold TH, the temperature and the characteristics of the amplifier remain the same or are barely changed, then the output power may be properly compensated by the gain control circuit 10.

Specifically, as shown in FIG. 2, the amplifier has stopped generating high output power for an elapsed time t since the current packet transmission duration TX[1] is completed, in which the elapsed time t is long enough (i.e., the time difference between the current packet transmission duration TX[1] and the next packet transmission duration TX[2] is greater than or equal to the threshold TH), so that the temperature and the characteristics of the amplifier have changed. However, the gain control circuit 10 still compensates the output power according to the characteristics of the current packet transmission duration TX[1], which leads to the output power at the next packet transmission duration TX[2] being overcompensated by an amount of excess power ΔP. On the other hand, a time difference between the next packet transmission duration TX[2] and the after next packet transmission duration TX[3] is short enough (i.e., the time difference between the next packet transmission duration TX[2] and the after next packet transmission duration TX[3] is smaller than the threshold TH), the temperature and the characteristics of the amplifier are regarded as being unchanged; the gain control circuit 10 may compensate the output power according to the characteristics of the next packet transmission duration TX[2], so that the output power at the after next packet transmission duration TX[3] can meet the target power TG[N].

From another point of view, the gain control circuit 10 may compensate the output power according to the environmental temperature TEMP, but the environmental temperature TEMP cannot reflect the temperature of the power amplifier PA. In addition, the gain control circuit 10 takes the current output power P[N] as a reference to calculate the next power P[N+1], but the current output power P[N] might be quite different from the next output power. Based on the situations as above mentioned, the gain control circuit 10 cannot properly compensate the output power under certain situations.

Figure 3:
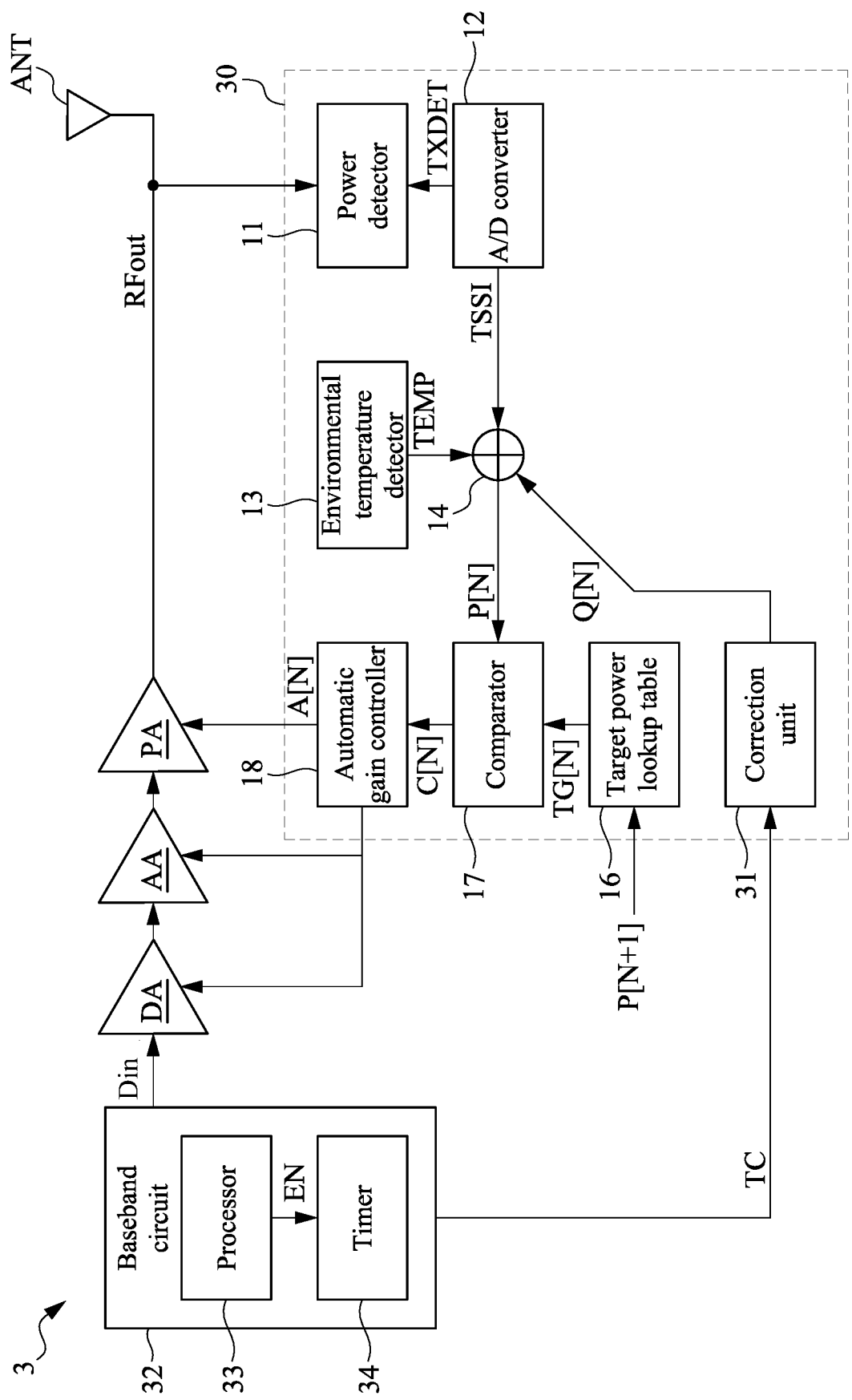
FIG. 3 is a functional block diagram of a transmitter according to an embodiment of the present disclosure.

FIG. 3 is a functional block diagram of a transmitter 3 according to an embodiment of the present disclosure. The transmitter 3 includes a gain control circuit 30, a baseband circuit 32, a digital amplifier DA, an analog amplifier AA, a power amplifier PA, and an antenna ANT. The gain control circuit 30 includes a power detector 11, an A/D converter 12, an environmental temperature detector 13, an adder 14, a target power lookup table 16, a comparator 17, and an automatic gain controller 18. Detailed structures and operations regarding the elements that are mentioned in the gain control circuit 10 in FIG. 1 may be obtained in descriptions regarding FIG. 1, and will not be reiterated herein.

It should be noted that in comparison with the gain control circuit 10 in FIG. 1, the gain control circuit 30 in FIG. 3 further includes a correction unit 31 configured to generate a correction power Q[N] to the adder 14 according to a correction signal TC. Thereafter, the adder 14 calculates the current output power P[N] according to the correction power Q[N], the transmitter signal strength indication and the environmental temperature TEMP currently. In one embodiment, the correction unit 31 may be a lookup table showing time versus power (or time versus efficiency). For example, by conducting experimental tests when the digital amplifier DA, the analog amplifier AA and the power amplifier PA are operating in a packet reception duration (or idle duration), a plurality of curves showing time versus temperature, efficiency, linearity and the like may be obtained, such that the correction power Q[N] can be generalized. As a result, the correction unit 31 may generate the correction power Q[N] according to the elapsed time since the packet reception duration (or idle duration) is completed.

The baseband circuit 32 includes a processor 33 and a timer 34. The processor 33 is connected to the digital amplifier DA, the analog amplifier AA and the power amplifier PA and the timer 34, and configured to generate an input signal Din to the digital amplifier DA, the analog amplifier AA and the power amplifier PA. The baseband circuit 32 is further configured to generate an enable signal EN to the timer 34. The timer 34 is connected to the processor 33 and the correction unit 31, and configured to generate the correction signal TC to the correction unit 31 according to enable signal EN. The timer 34 is further configured to generate an elapsed time of the packet reception duration (or idle duration) to be read by the correction unit 31.

Figure 4:
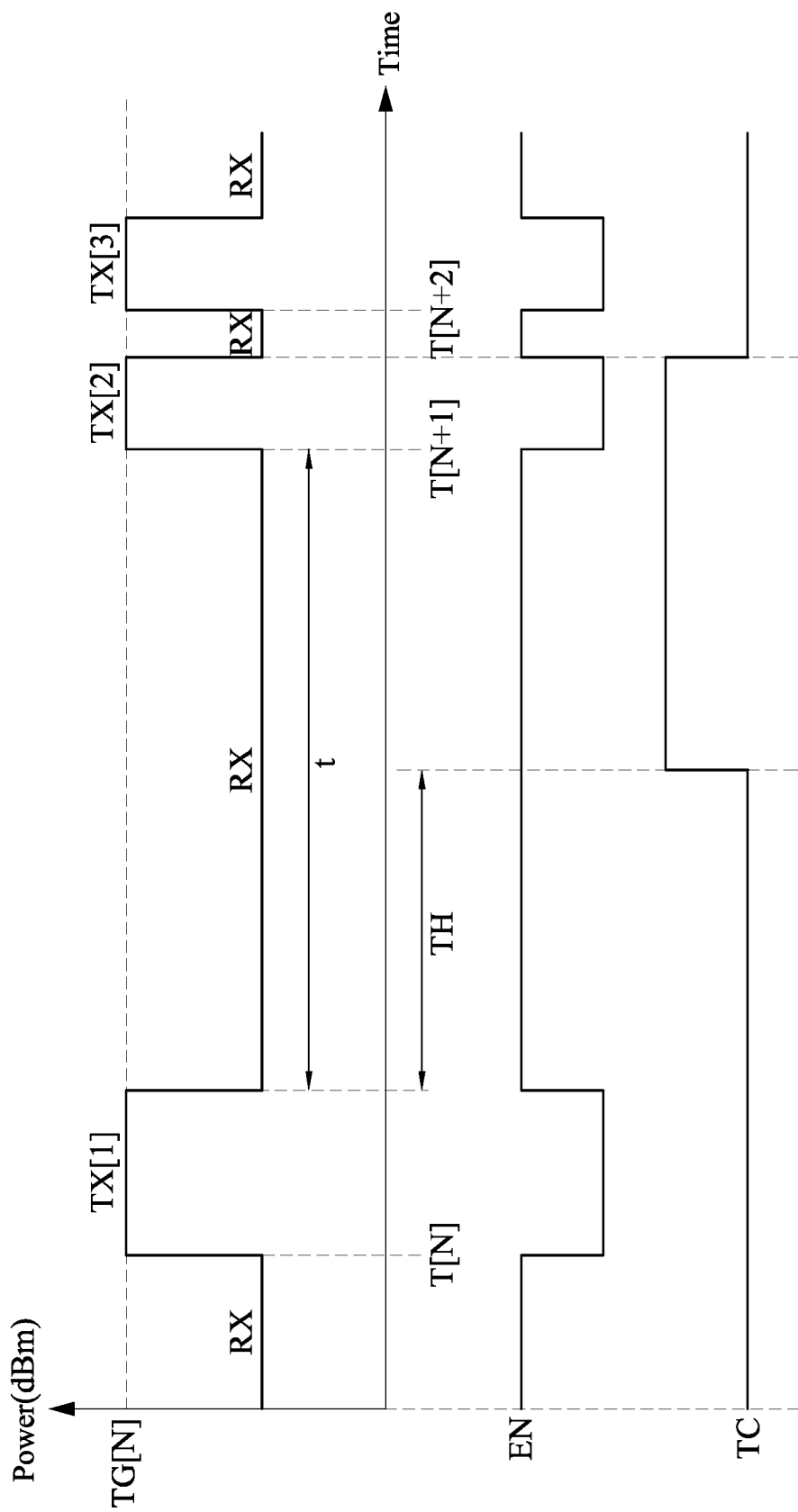
FIG. 4 is a schematic view of signal timing including an output power of the power amplifier in FIG. 3, an enable signal and a correction signal of the baseband circuit in FIG. 3 according to an embodiment of the present disclosure.

FIG. 4 is a schematic view of signal timing including an output power of the power amplifier PA in FIG. 3, the enable signal EN and the correction signal TC of the baseband circuit 32 in FIG. 3 according to an embodiment of the present disclosure. In one embodiment, when a packet transmission duration TX is completed (or a packet reception duration RX begins), the processor 33 of the baseband circuit 32 sets the enable signal EN to a first logic state (e.g., logic "1"), such that the timer 34 starts timing from zero seconds; when a next packet transmission duration TX begins (or the packet reception duration RX is completed), the processor 33 of the baseband circuit 32 sets the enable signal EN to a second logic state (e.g., logic "0"), such that the timer 34 stops timing. In one embodiment, the timer 34 sets the correction signal TC to the second logic state when the timer 34 determines that an elapsed time t is smaller than a threshold TH, such that the correction unit 31 does not generate the correction power Q[N]; and the timer 34 sets the correction signal TC to the first logic state when the timer 34 determines that the elapsed time t is greater than or equal to threshold TH, such that the correction unit 31 generates the correction power Q[N].

For example, as shown in FIG. 4, the enable signal EN is set to the logic "0" state when a current packet transmission duration TX[1] begins at a current time T[N], such that the timer 34 does not time. The enable signal EN is set to the logic "1" state when the current packet transmission duration TX[1] is completed, such that the timer 34 starts timing from zero seconds. The timer 34 sets the correction signal TC to the logic "1" state when the timer 34 determines that the elapsed time t is greater than or equal to the threshold TH, such that the correction unit 31 generates the correction power Q[N]. For example, when the correction signal TC is set to the logic "1" state, the correction unit 31 reads the elapsed time timed by the timer 34, and looks up the correction power Q[N] corresponding to the elapsed time t. When a next packet transmission duration TX[2] is about to start at a next time T[N+1], the adder 14 of the gain control circuit 30 calculates a next output power P[N+1] according to the correction power Q[N], such that the next output power P[N+1] will not be overcompensated. Afterwards, within the next packet transmission duration TX[2], the enable signal EN set is set to the logic "0" state, such that the timer 34 does not time. Therefore, since the elapsed time timed by the timer 34 does not change within the next packet transmission duration TX[2], the correction power Q[N] generated by the correction unit 31 remains unchanged. Until the next packet transmission duration TX[2] is completed, the correction signal TC is set to the logic "0" state, such that the correction unit 31 does not generate the correction power Q[N].

In short, in the embodiments of the present disclosure, the correction signal TC is set to the logic "1" state when the elapsed time t since the current packet transmission duration TX[1] is completed is greater than or equal to the threshold TH, such that the correction unit 31 generates the correction power Q[N]. Therefore, the gain control circuit 30 of the present disclosure may calculate the next output power P[N+1] and adjust the gain A[N] according to the correction power Q[N], so that the next output power P[N+1] will not be overcompensated. In comparison with FIG. 2, the output power of the next packet transmission duration TX[2] in FIG. 4 is reduced by the amount of excess power ΔP, so as to meet the target power TG[N].

In one embodiment, the correction unit 31 and the timer 34 may be realized by a hardware circuit or a software program. When the correction unit 31 and the timer 34 is realized by a software program, the gain control circuit 30 of the present disclosure may be implemented in any existed transmitter, therefore the present disclosure has advantageous effect of compatibility and easy integration.

Figure 5:
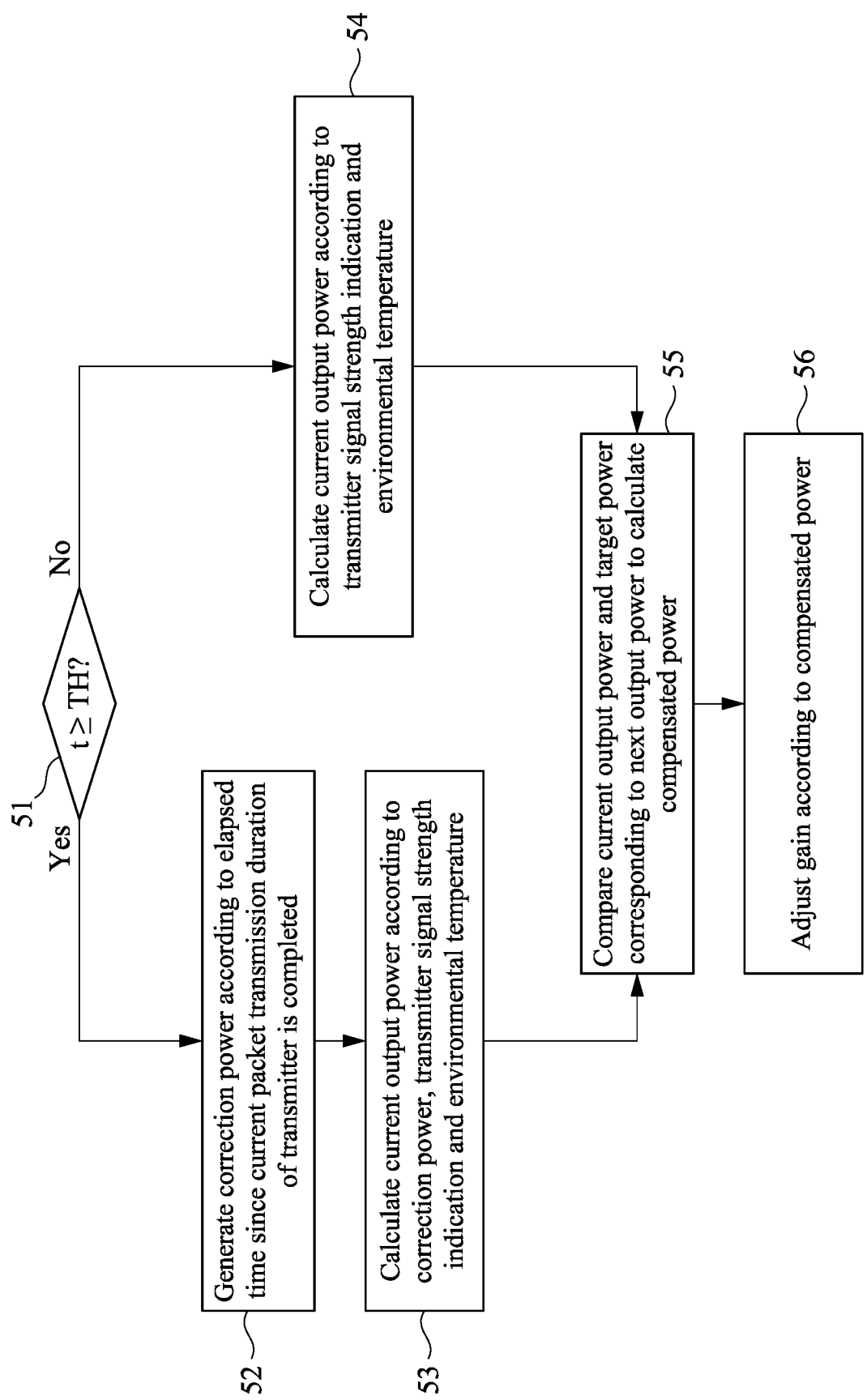
FIG. 5 is a flowchart of a gain control process according to an embodiment of the present disclosure.

Operations of the gain control circuit 30 may be summarized into a gain control process, as shown in FIG. 5, and the gain control process includes the following steps.

Step 51: Determine whether or not an elapsed time t since a current packet transmission duration of a transmitter is completed is greater than or equal to a threshold TH. Go to Step 52 if yes; go to Step 54 if no.

Step 52: Generate a correction power according to the elapsed time since the current packet transmission duration of the transmitter is completed.

Step 53: Calculate a current output power according to the correction power, a transmitter signal strength indication and an environmental temperature. Go to Step 55.

Step 54: Calculate the current output power according to transmitter signal strength indication and environmental temperature.

Step 55: Compare the current output power and a target power corresponding to a next output power, to calculate a compensated power.

Step 56: Adjust a gain according to the compensated power.

Detailed operations regarding the gain control process may be obtained by referring to descriptions regarding FIG. 3 and FIG. 4, and will not be reiterated herein. In one embodiment, the gain control process may be compiled into a program code to be stored in a memory circuit of the transmitter, the program code may instruct the baseband circuit 32 and the gain control circuit 30 to realize automatic power tracking and adjust the gain A[N] of the digital amplifier DA, the analog amplifier AA and the power amplifier PA accordingly.

To sum up, in the present disclosure, the gain control circuit and process thereof are configured to adjust the gain according to the correction power when the elapsed time since the current packet transmission duration is completed is greater than or equal to the threshold, such that the next output power will not be overcompensated. Therefore, the difference between the output power and the target power of the transmitter can be minimized.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A gain control circuit utilized in a transmitter including a digital amplifier, an analog amplifier and a power amplifier, the digital amplifier, the analog amplifier and the power amplifier being configured to amplify an input signal according to a gain to generate an output signal, and the gain control circuit comprising:
   a correction unit configured to generate a correction power according to an elapsed time since a current packet transmission duration of the transmitter is completed;
   an adder connected to the correction unit, and configured to calculate a current output power according to the correction power, a transmitter signal strength indication of the input signal and an environmental temperature of the transmitter;
   a target power lookup table configured to generate a target power corresponding to a next output power;
   a comparator connected to the adder and the target power lookup table, and configured to compare the current output power and the target power to calculate a compensated power; and
   an automatic gain controller connected to the comparator and the power amplifier, and configured to adjust the gain according to the compensated power.

2. The gain control circuit of claim 1, further comprising:
   a power detector connected to an output terminal of the power amplifier, and configured to generate a detected power according to the output signal;
   an analog-to-digital converter connected to the power detector, and configured to convert the detected power into the transmitter signal strength indication; and
   an environmental temperature detector connected to the adder, and configured to detect the environmental temperature.

3. The gain control circuit of claim 1, wherein the transmitter includes a baseband circuit, and the baseband circuit includes:
   a processor connected to an input terminal of the power amplifier, and configured to generate the input signal to the digital amplifier, the analog amplifier and the power amplifier, and generate an enable signal; and
   a timer connected to the processor and the correction unit, and configured to generate a correction signal to the correction unit according to the enable signal.

4. The gain control circuit of claim 3, wherein
   the processor sets the enable signal to a first logic state since the current packet transmission duration is completed or a packet reception duration of the transmitter begins, such that the timer starts timing from zero seconds; and
   the processor sets the enable signal to a second logic state since a next packet transmission duration of the transmitter begins or the packet reception duration is completed, such that the timer stops timing.

5. The gain control circuit of claim 3, wherein
   the timer sets the correction signal to a first logic state when the elapsed time since the current packet transmission duration is completed is greater than or equal to a threshold, such that the correction unit generates the correction power; and
   the timer sets the correction signal to a second logic state when the elapsed time since the current packet transmission duration is completed is smaller than the threshold, such that the correction unit does not generate the correction power.

6. The gain control circuit of claim 5, wherein, when the elapsed time since the current packet transmission duration is completed is greater than or equal to the threshold, the timer sets the correction signal to the second logic state until a next packet transmission duration is completed, such that the correction unit does not generate the correction power.

7. The gain control circuit of claim 5, wherein, when the correction signal is set to the first logic state, the correction unit reads the elapsed time timed by the timer, and looks up the correction power corresponding to the elapsed time.

8. The gain control circuit of claim 1, wherein the transmitter is utilized in a wireless communication device, and the wireless communication device is a microwave integrated circuit transceiver or a microwave transceiver system.

9. The gain control circuit of claim 1, wherein the transmitter includes an antenna connected to the output terminal of the power amplifier and the power detector, and configured to radiate the output signal to the air.

10. A gain control method utilized in a transmitter including a digital amplifier, an analog amplifier and a power amplifier, the digital amplifier, the analog amplifier and the power amplifier being configured to amplify an input signal according to a gain to generate an output signal, and the gain control method comprising:
    generating a correction power according to an elapsed time since a current packet transmission duration of the transmitter is completed;
    calculating a current output power according to the correction power, a transmitter signal strength indication of the input signal, and an environmental temperature of the transmitter;
    comparing the current output power and a target power corresponding to a next output power to calculate a compensated power; and
    adjusting the gain of the digital amplifier, the analog amplifier and the power amplifier according to the compensated power.

11. The gain control method of claim 10, further comprising:
    starting timing from zero seconds to generate the elapsed time since the current packet transmission duration is completed or a packet reception duration of the transmitter begins; and
    stopping timing since a next packet transmission duration of the transmitter begins or the packet reception duration is completed.

12. The gain control method of claim 10, wherein the step of generating the correction power includes:
    generating the correction power when the elapsed time since the current packet transmission duration is completed is greater than or equal to a threshold; and
    not generating the correction power when the elapsed time since the current packet transmission duration is completed is smaller than the threshold.

13. The gain control method of claim 12, wherein the step of generating the correction power includes:
    when the elapsed time since the current packet transmission duration is completed is greater than or equal to the threshold, not generating the correction power until a next packet transmission duration is completed.

14. The gain control method of claim 12, wherein the step of generating the correction power includes:

reading the elapsed time when the elapsed time since the current packet transmission duration is completed is greater than or equal to the threshold; and looking up the correction power corresponding to the elapsed time.

15. The gain control method of claim 12, wherein the step of generating the correction power includes:

reading the elapsed time within a next packet transmission duration when the elapsed time since the current packet transmission duration is completed is greater than or equal to the threshold; and looking up the correction power corresponding to the elapsed time.

16. The gain control method of claim 10, wherein the transmitter is utilized in a wireless communication device, and the wireless communication device is a microwave integrated circuit transceiver or a microwave transceiver system.

* * * * *